United States Patent [19]

Guittard et al.

[11] Patent Number: 4,518,980

[45] Date of Patent: May 21, 1985

[54] SEMICONDUCTOR DEVICE FOR THE VACUUM-EMISSION OF ELECTRONS

[75] Inventors: Pierre Guittard, Montlhery Longpont; Philippe Jarry, Sucy-en-Brie; Alphonse Ducarre, Sainte-Genevieve-des-Bois; Lazhar Haji, Paris, all of France

[73] Assignee: U.S. Philips Corporation, New York, N.Y.

[21] Appl. No.: 380,633

[22] Filed: May 21, 1982

[30] Foreign Application Priority Data

Jun. 3, 1981 [FR] France ................................ 81 10993

[51] Int. Cl.[3] .................... H01L 29/161; H01L 27/14; H01L 31/00; H01L 29/205

[52] U.S. Cl. ........................................ 357/30; 357/16; 357/90; 313/385; 313/386; 313/542

[58] Field of Search ............................ 357/30, 16, 90; 313/385, 386, 542

[56] References Cited

U.S. PATENT DOCUMENTS

| | | | |
|---|---|---|---|
| 3,478,213 | 11/1969 | Simon et al. | 357/30 |
| 3,631,303 | 12/1971 | Antypas et al. | 357/30 |
| 3,868,523 | 2/1975 | Klopfer et al. | 357/30 |
| 3,959,038 | 5/1976 | Gutierrez et al. | 357/16 |
| 3,981,755 | 9/1976 | Gowers | 357/30 |
| 4,119,994 | 10/1978 | Jain et al. | 357/30 |

FOREIGN PATENT DOCUMENTS 2045524 10/1980 United Kingdom .

*Primary Examiner*—Martin H. Edlow
*Assistant Examiner*—Jerome Jackson
*Attorney, Agent, or Firm*—Robert J. Kraus

[57] ABSTRACT

An electron emitting device including an active semiconductor layer having a surface from which electrons are emitted. The layer is doped with impurity atoms at a density which decreases with distance from the surface.

10 Claims, 2 Drawing Figures

SEMICONDUCTOR DEVICE FOR THE VACUUM-EMISSION OF ELECTRONS

BACKGROUND OF THE INVENTION

The invention relates to a semiconducor device for the vacuum-emission of electrons through one of the surfaces of said semiconductor device.

Such semiconductor devices may be, for example, photocathodes which are used in camera tubes or photomultipliers. Such photocathodes ensure a conversion of photons into electrons. The semiconductor devices, however, may also be dynodes which are used in photomultipliers which operate with secondary electron emission.

Electron emitter devices which generally operate in a vacuum are known from U.S. Pat. No. 3,959,038 both as regards their structure and their manufacturing process. This specification describes photocathodes of GaAs which operate in transmission, which means that photons enter on one side and electrons emanate on the other side.

These devices comprise an active layer which adjoins the emitter surface and in which at least three physical processes occur. The first process is the excitation of an electron, for example, under the influence of radiation (light) in the case of the photocathodes. The second process is the diffusion of said electron in the active layer. The third process is the emission into a vacuum of an electron. These three different physical processes are based on different physical laws and depend on other parameters.

SUMMARY OF THE INVENTION

It is an object of the invention to provide semiconductor devices having improved excitation, diffusion and emission of the electrons.

The semiconductor device according to the present invention is characterized in that it has a so-called active semiconductor layer which adjoins the emissive surface and the doping of which increases as the distance to the emissive surface decreases.

The active layer of this device has characteristic features which vary as a function of the distance to the emissive surface. The diffusion length at a larger distance from the emissive surface in the layer is large due to a low doping. As a result of this the diffusion of the excited electrons is improved. The emission probability at the surface is high due to a high doping.

According to an embodiment of the invention the active semiconductor layer consists of at least two different doping zones, the zone near the emissive surface being comparatively highly doped. In this case the doping varies stepwise instead of continuously, effecting separation of the diffusion and emission functions.

Finally, according to a special embodiment of the invention, the active layer is of a III-V compound, for example, gallium arsenide, of p-conductivity type having a thickness smaller than 10 microns, having a doping along the axis perpendicular to the emissive surface which varies continuously or discontinuously between $10^{18}$ and $10^{19}$ atoms/cm$^3$.

There are two types of electron emitter devices. The former type operates in transmission and the latter operates in reflection. The invention may be used in devices of both types.

BRIEF DESCRIPTION OF THE DRAWING

The invention will be described in greater detail, by way of example, with reference to the accompanying drawing, in which.

DESCRIPTION OF THE PREFERRED EMBODIMENTS

Figure 1:
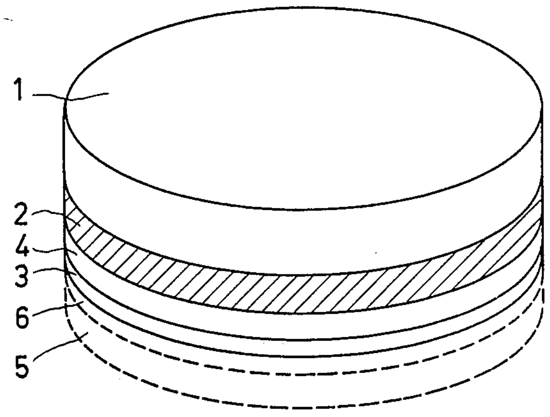
FIG. 1 shows a photocathode which operates in transmission and emits electrons by absorption of light rays.

Such a photocathode is formed by sealing on a substrate 1 of glass (or of corundum) a complex semiconductor structure by means of a sealing layer 2. Said sealing layer consists, for example, of a glass of the short type which is described in French Patent Application No. 75 03 429 corresponding to U.S. Pat. No. 4,038,576. The semiconductor structure consists of a semiconductor layer 3, the so-called "active layer ", which in general is of gallium arsenide of the p-conductivity type, and an extra layer 4, the so-called "passivating layer" which is provided between the glass and the active layer and the function of which is to reduce the recombination rate at the interface. In the case of an active layer 3 of GaAs (p) said layer consists of gallium arsenide and aluminium arsenide, $Ga_{1-y}Al_yAs$, also of the p-conductivity type. The spectral band of the radiation is established by layer 4. For example, at $y=0.50$ it permits the passage of radiation the wavelength of which is larger than 0.60 $\mu$m.

Finally the active semiconductor layer 3 shows a negative affinity for electrons on its outer surface which is exposed to the vacuum. This is obtained, for example, by a surface treatment which is known in the art and which involves covering with caesium and oxygen.

Such a composite glass-semiconductor material is not obtained by gluing. It is necessary first to grow a double hetero structure on a substrate and then to remove again the first hetero structure by chemical etching.

The manufacture of such a structure is carried out by the epitaxial growth of layers 6, 3 and 4 on a substrate 5 of GaAs, (which is shown in broken lines in the Figure, because it is destined to be removed). The first layer 6 is of $Ga_{1-x}Al_xAs$ (in which x usually has the value 0.5). The layer 6 is the so-called "chemical stopper layer" or blocking layer. The second layer is of GaAs, the so-called "active layer " 3 of the p-conductivity type, which p-conductivity is obtained, for example, by doping with zinc (Zn) or with germanium (Ge). The third layer 4 is of $Ga_{1-y}Al_yAs$ (where y varies between 0.25 and 1 in accordance with the desired characteristics), the so-called passivating layer the functions of which were described hereinbefore.

The growth of these layers can be realized by liquid phase epitaxy or by vapour phase epitaxy, for example, according to the organo-metallic method. This structure is then secured on a substrate 1 of glass (or of corundum), which substrate serves as a carrier and as an optical window. This securing or sealing can be carried out by means of a glass layer 2 in which the so-called passivating layer 4 lies nearest to the glass structure 1, which explains the term of photocathode "of inverse structure".

After securing the structure, the substrate 5 and the chemical stopper layer 6 are removed by a chemical etching treatment. An example of the bath which is used for the chemical etching of the substrate 1 of GaAs is a 5% by volume solution of $NH_4OH$ (~40%) in $H_2O_2$ (~30%). This bath has the advantage that the comparatively high etching rate and an excellent selectivity with respect to the stopper layer are obtained. This layer 6 is then removed, for example, by a commercially available diluted 40% by volume bath of hydrofluoric acid, which bath does not substantially attack the underlying GaAs.

Finally, after all these processes, the active layer 3 is brought to an optimum thickness for example, by a slight chemical etching treatment. The layer is then activated in a high vacuum hood and a photocathode is obtained.

The absorption of a photon in the semiconductor material causes the excitation of an electron which then passes through the valence band to the conduction band and which will diffuse in the material, after thermalization, during the time when it remains mobile (lifetime $\tau$) over an average distance $L_D$ (diffusion length). The impurity atoms introduce extra energy levels in the forbidden band of the material the location and density of which vary the lifetime of the charge carriers (traps) and hence the diffusion length thereof. In general the diffusion length is a decreasing function of the doping, which means that the material should only be weakly doped to cause said length to increase.

When the electron excited in this manner reaches the interface GaAs/vacuum, it can be emitted in the vacuum on the condition that the material is brought into an apparent negative affinity state. The emission probability depends on various factors including the crystal orientation, the doping, and increases with the doping level.

So these criteria are opposite and the solution thus far was to realize a compromise in the doping value. The materials realized so far are considered acceptable when the diffusion length reaches 4 $\mu$m with a doping of $1\times10^{19}$ atoms/cm$^3$.

It is the object of the invention to improve the apparent diffusion length by a new structure of the active layer.

According to the present invention the active layer 3 has a doping which increases as the distance to the emissive surface decreases.

In this manner, an electron excited as a result of radiation absorption will diffuse into the material over a larger length as a result of the doping being smaller with depth, while the emission probability in the vacuum will be comparatively high because the doping near the emissive surface will be stronger.

According to an embodiment the active layer of a photo-emitter is obtained in the form of two discrete doping zones in gallium arsenide of p-conductivity type which is doped with a material having a small coefficient of diffusion, for example germanium (Ge).

Zone I thickness = 4 $\mu$m $N_A - N_D \sim 1$ to $2\times10^{18}$ atoms/cm$^3$ $L_{D,1} = 8$ $\mu$m Zone II thickness = 1 $\mu$m $N_A - N_D \sim 1$ to $2\times10^{19}$ atoms/cm$^3$ $L_{D,2} = 4$ $\mu$m Such a structure operating as a photo-emitter and having an overall thickness of 5 microns has an apparent diffusion length: $L_{D,app} \simeq 7$ $\mu$m.

A continuous variation of the doping can be obtained both by a continuously variable doping with impurities during the growth, for example, in the vapour phase epitaxy reactor, and by diffusion due to the choice of a doping impurity having a larger diffusion coefficient, for example zinc (Zn).

This structure can also be obtained with any other semiconductor material, for example III-V compounds or the binary or pseudo-binary II-VI compounds in which the values of the compositions, dopings and layer thicknesses are then adapted to each individual case and can easily be determined by those skilled in the art.

The invention is not restricted to photocathodes but may also be used in the manufacture of dynodes or in general in any electron emissive semiconductor device.

Figure 2:
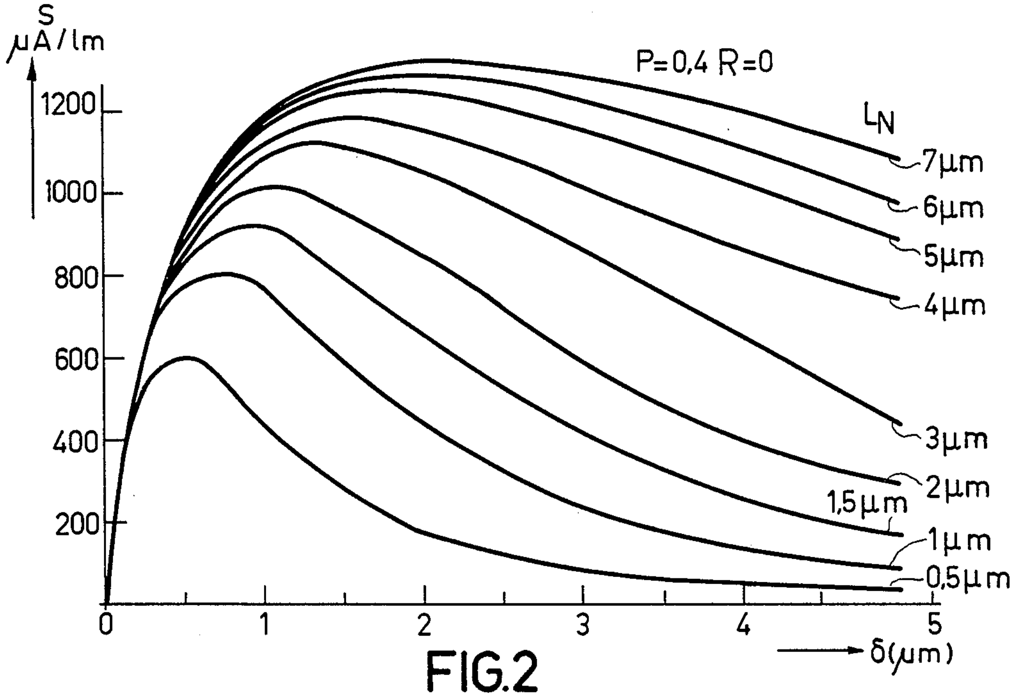
FIG. 2 shows a network of curves showing the relationship between sensitivity and thickness of the active layer.

FIG. 2 shows a network of computed curves which indicate the variation of the sensitivity (in $\mu$ A/lumen) for white light (2854° K.) of photocathodes having an inverted structure according to the present invention, as a function of the thickness (in micrometers) of the active layer 3 of GaAs for various values of the apparent electronic diffusion length (in micrometers) and for which P represents the emission probability of the photo electrons, and R the recombination rate of the photoelectrons at the interface GaAs/GaAlAs.

From this figure it appears that the sensitivity maximum increases with the diffusion length, which corresponds to practice. It also follows that the optimum thickness of the active layer 3 of GaAs increases, which facilitates the manufacture thereof, and that the curves become flatter so that the choice of the thickness becomes less critical, which is an added benefit in the manufacture of these structures.

It will be obvious to those skilled in the art that numerous variations may be considered without departing from the scope of the present invention as defined by the appended claims.

What is claimed is:

1. An electron emitting device including an active semiconductor layer having a surface for emitting electrons into a vacuum, characterized in that said active layer is doped through at least a substantial portion of its thickness with impurity atoms, the density of said atoms decreasing with distance from said surface.

2. An electron emitting device as in claim 1 where said density decreases gradually with distance from said surface.

3. An electron emitting device as in claim 1 where said density decreases suddenly at a predetermined distance from said surface.

4. An electron emitting device as in claim 1, 2 or 3 characterized in that the semiconductor layer doped with impurity atoms consists essentially of a compound having elements selected from columns III and V of the Periodic Table.

5. An electron emitting device as in claim 1, 2 or 3 characterized in that the semiconductor layer doped with impurity atoms consists essentially of a compound having elements selected from columns II and VI of the Periodic Table.

6. An electron emitting device as in claim 4 where said layer consists essentially of gallium arsenide doped with p-type impurity atoms.

7. An electron emitting device as in claim 6 where the thickness of the active semiconductor layer does not exceed approximately 20 microns.

8. An electron emitting device as in claim 7 where said density of the impurity atoms decreases from approximately $10^{19}$ to $10^{18}$ atoms/centimeter$^3$.

9. A photocathode including an active semiconductor layer having a surface for emitting electrons into a vacuum, characterized in that said active layer is doped through at least a substantial portion of its thickness with p-type impurity atoms, the density of said atoms decreasing with distance from said surface.

10. A photomultiplier dynode including an active semiconductor layer having a surface for emitting electrons into a vacuum, characterized in that said active layer is doped through at least a substantial portion of its thickness with p-type impurity atoms, the density of said atoms decreasing with distance from said surface.

* * * * *